United States Patent
Lin et al.

(10) Patent No.: US 6,492,700 B1
(45) Date of Patent: Dec. 10, 2002

(54) THIN FILM TRANSISTOR LIQUID CRYSTAL DISPLAY DEVICE

(75) Inventors: Ming-Tien Lin, Taipei Hsien (TW); Tean-Sen Jen, Chiai (TW)

(73) Assignee: HannStar Display Corp., Taipei (TW)

(*) Notice: Subject to any disclaimer, the term of this patent is extended or adjusted under 35 U.S.C. 154(b) by 0 days.

(21) Appl. No.: 10/095,979

(22) Filed: Mar. 12, 2002

(30) Foreign Application Priority Data

Sep. 12, 2001 (TW) ........................................ 90122573 A

(51) Int. Cl.⁷ ..................... H01L 31/0232; H01L 29/04; H01L 31/20; H01L 31/036; H01L 31/0376
(52) U.S. Cl. ..................... 257/435; 257/59; 257/72; 257/350; 257/435; 257/440
(58) Field of Search .................... 257/59, 72, 350, 257/294, 435, 440

(56) References Cited

U.S. PATENT DOCUMENTS 5,042,918 A * 8/1991 Suzuki
5,952,708 A * 9/1999 Yamazaki ................... 257/643
6,362,030 B1 * 3/2002 Nagayama et al. ......... 438/151

* cited by examiner

*Primary Examiner*—Ngân V. Ngô
(74) *Attorney, Agent, or Firm*—Merchant & Gould; Tim Tingkang Xia

(57) ABSTRACT

A method of manufacturing a thin film transistor liquid crystal display device. The method includes the steps of providing a first substrate and a second substrate, the first substrate positioned facing the second substrate; forming a black matrix layer on the first substrate, the black matrix layer including an opening exposing the first substrate; forming a coating layer on the black matrix layer and the opening; forming a light shielding layer on the second substrate facing the opening, the area of the light shielding layer being larger than the area of the opening; forming a insulator layer on the light shielding layer and the second substrate; and forming a sealant layer between the coating layer and the insulator layer. The method of the present invention increases the adhesive strength between the black matrix and the substrate.

8 Claims, 5 Drawing Sheets

THIN FILM TRANSISTOR LIQUID CRYSTAL DISPLAY DEVICE

BACKGROUND OF THE INVENTION

1. Field of the Invention

The present invention relates in general to a method of manufacturing a liquid crystal display (LCD) device. In particular, the present invention relates to a method of manufacturing a thin film transistor liquid crystal display (TFT LCD) device.

2. Description of the Related Art

FIG. 1 shows a sectional view of a conventional thin film transistor liquid crystal display device. The conventional thin film transistor liquid crystal display device includes a color filter substrate 10, a black matrix 12, a coating layer 14, a conductor layer (ITO layer) 16, a sealant layer 18, a thin film transistor array substrate 20, and an insulator layer 22. In above conventional thin film transistor liquid crystal display device, the black matrix 12 is widely used as light shielding layer of the color filter substrate 10. However, since the adhesive strength between the black matrix 12 and the color filter substrate 10 is poor, the black matrix 12 is easily peels off from the color filter substrate 10 when impacted by an external force. Because the black matrix 12 is mainly composed of polymer and light shielding agent, there are two common ways to strengthen the adhesive strength between the black matrix 12 and the color filter substrate 10: one is to increase the specific weight of polymer; the other is to find better light shielding agent. However, as the specific weight of polymer increases, the optical density of polymer decreases. Moreover, the process of finding better light shielding agent is time consuming. Hence, a simple way to improve the adhesive strength between the black matrix and the substrate is very important.

SUMMARY OF THE INVENTION

The present invention is intended to overcome the above-described disadvantages.

The present invention provides a method of manufacturing a thin film transistor liquid crystal display device, including the steps of: providing a first substrate and a second substrate, the first substrate positioned facing the second substrate; forming a black matrix layer on the first substrate, the black matrix layer including an opening exposing the first substrate; forming a coating layer on the black matrix layer and the opening; forming a light shielding layer on the second substrate facing the opening, the area of the light shielding layer being larger than the area of the opening; forming a insulator layer on the light shielding layer and the second substrate; and forming a sealant layer between the coating layer and the insulator layer.

The method of the present invention successfully increases the adhesive strength between the black matrix and the substrate. Therefore, when a thin film transistor liquid crystal display device using the present invention method is impacted by external force, the black matrix doesn't peel off from the substrate. Another object of the present invention is to provide a thin film transistor liquid crystal display device manufactured by above method, including a first substrate and a second substrate, the first substrate positioned facing the second substrate; a black matrix layer formed on the first substrate, the black matrix layer including an opening exposing the first substrate; a coating layer formed on the black matrix layer and the opening; a light shielding layer formed on the second substrate facing the opening, the area of the light shielding layer being larger than the area of the opening; a insulator layer formed on the light shielding layer and the second substrate; and a sealant layer formed between the coating layer and the insulator layer.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Embodiment 1

Figure 1:
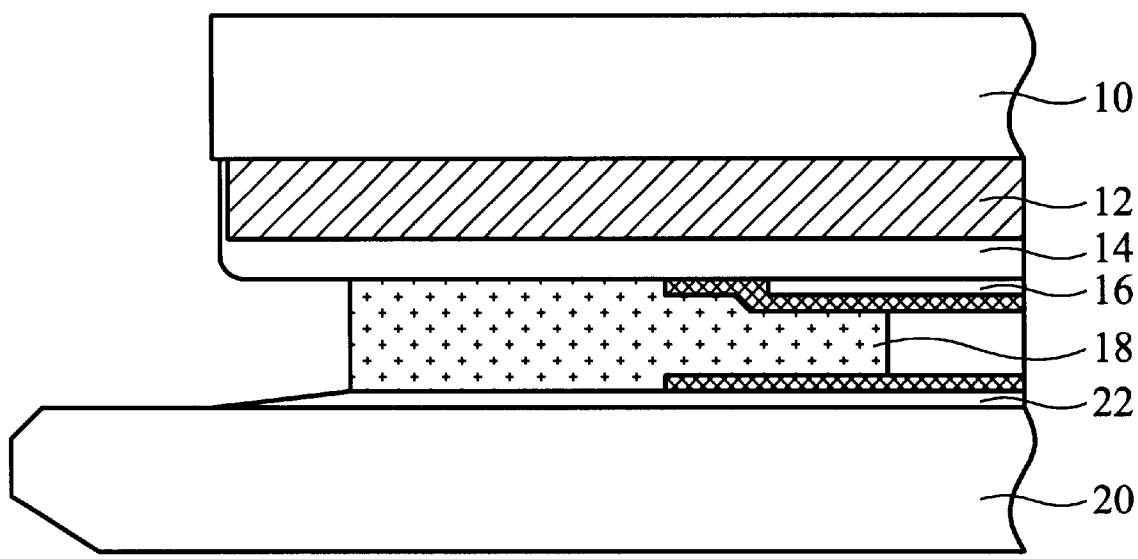
FIG. 1 is a sectional view of a conventional thin film transistor liquid crystal display device.
Figure 2A:
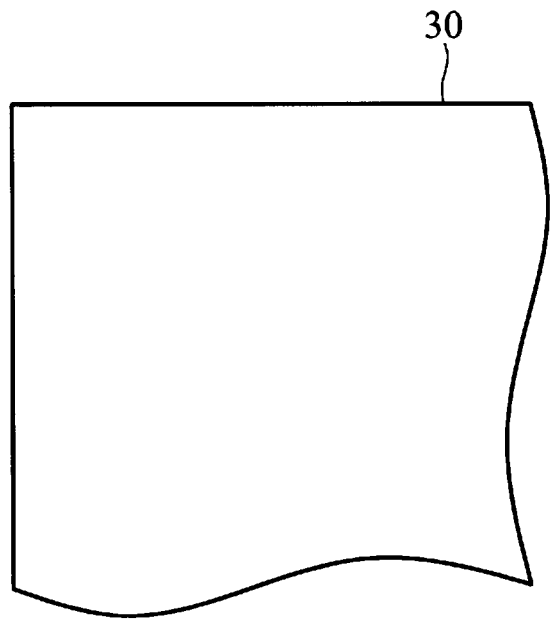
FIGS. 2a to 2e are sectional views showing embodiment 1 of the method of manufacturing a thin film transistor liquid crystal display device according to the present invention.

First, as shown in FIG. 2a, a color filter substrate (CF substrate) 30 is provided.

Figure 2B:
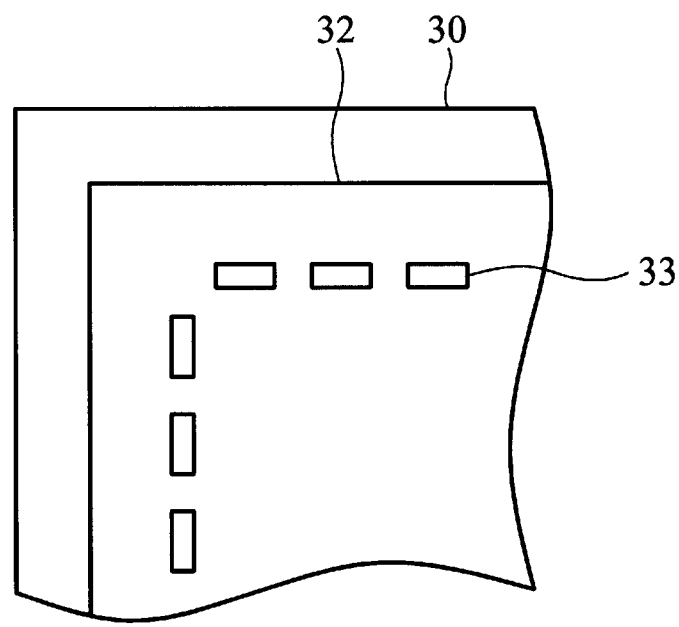

Secondly, as shown in FIG. 2b, a black matrix layer 32 is deposited on the CF substrate 30, and the black matrix layer 32 having plural openings 33 near the edges to expose the CF substrate 30.

Figure 2C:
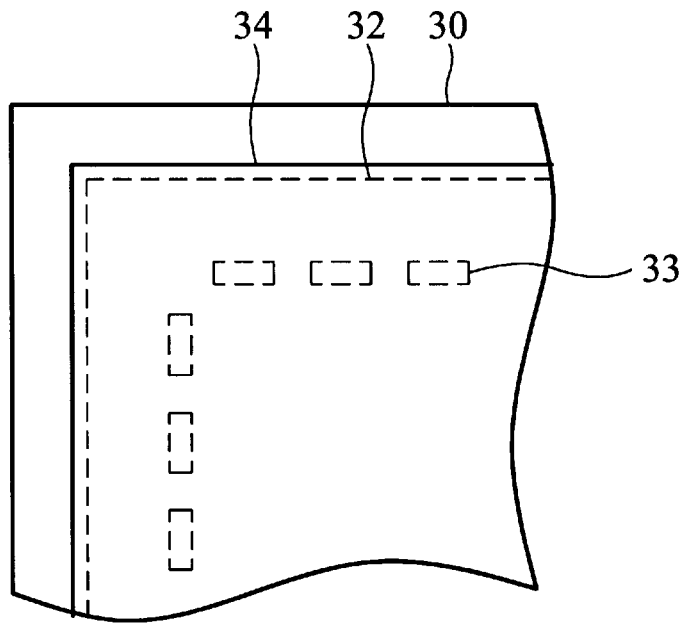

Next, as shown in FIG. 2c, an over coat layer 34 is coated over the black matrix layer 32.

Figure 2D:
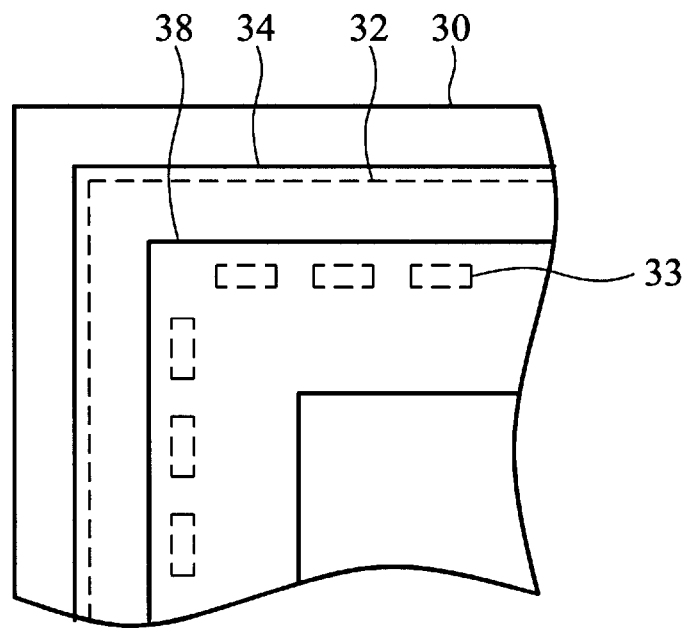

Moreover, as shown in FIG. 2d, a sealant layer 38 is formed on the over coat layer 34.

Figure 2E:
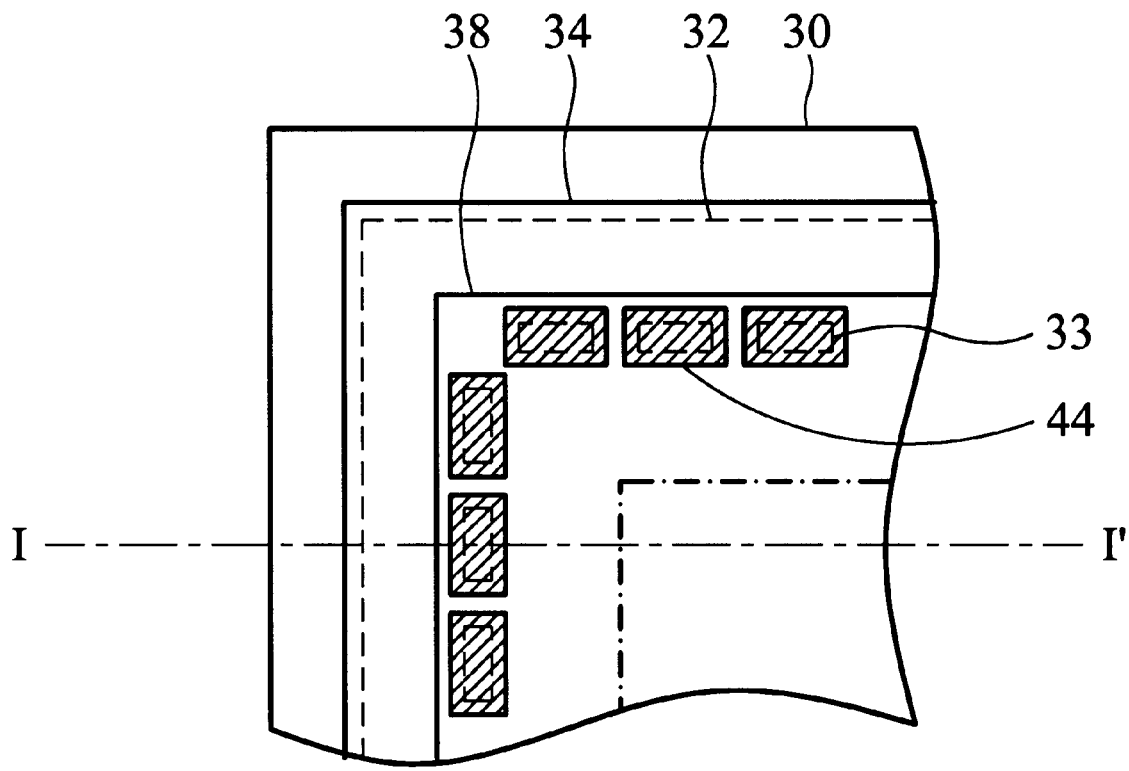
Figure 4:
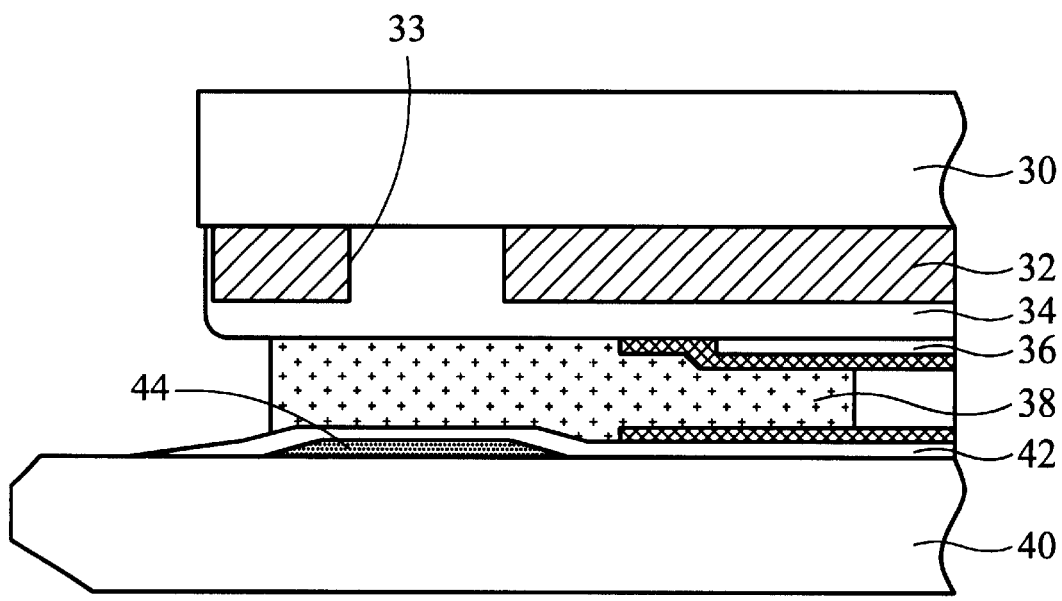
FIG. 4 is a sectional view of FIG. 2e along line I–I'.

Lastly, referring to FIG. 4, a thin film transistor array substrate 40 which includes preformed plural light shielding layers 44 and an insulator layer 42 is superposed on CF substrate 30, wherein the plural light shielding layers 44 and the plural openings 33 are face-to-face, as shown in FIG. 2e.

FIG. 4 shows a sectional view of FIG. 2e along line I–I'. According to FIG. 4, because the over coat layer 34 directly contacts the CF substrate 30 via the openings 33, the adhesive strength between the black matrix layer 32 and the CF substrate 30 is substantially increased. Therefore, even if above substrate is impacted by an external force, the black matrix layer 32 doesn't peel off from the CF substrate 30. Furthermore, in this case, because the light shielding layer 44 is used to prevent the light leakage through the openings 33, the area of the light shielding layer 44 is preferably larger than the area of the openings 33. Moreover, the light shielding layer 44, is preferably composed of metal.

Embodiment 2

Figure 3:
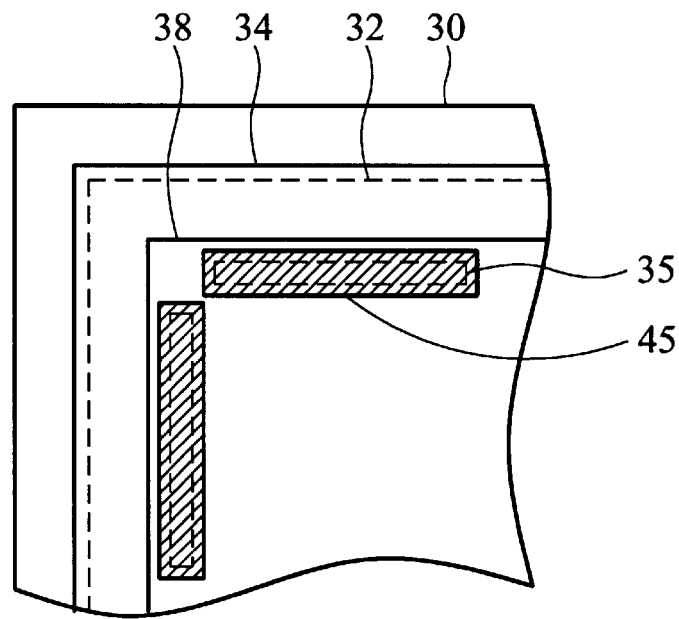
FIG. 3 is a sectional view showing embodiment 2 of the thin film transistor liquid crystal display device according to the present invention.

FIG. 3 is a sectional view showing embodiment 2 of the thin film transistor liquid crystal display device according to the present invention. In this embodiment, the plural openings 33 are modified to bar openings 35, and the plural light shielding layers 44 are modified to bar light shielding layers 45. The length of the bar openings 35 or the bar light shielding layers 45 is larger than above openings 33 or above light shielding layer 44. The other steps of the embodiment 2 are the same as above embodiment 1.

Because the over coat layer 34 directly contacts the CF substrate 30 via the bar opening 35, the adhesive strength between the black matrix layer 32 and the CF substrate 30 is substantially increased. Therefore, even if above substrate is impacted by an external force, the black matrix layer 32 doesn't peel off from the CF substrate 30. Moreover, the light shielding layer 45, is preferably composed of metal.

While the present invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing a thin film transistor liquid crystal display device, comprising the steps of:
   providing a first substrate and a second substrate, the first substrate positioned facing the second substrate;
   forming a black matrix layer on the first substrate, the black matrix layer including an opening exposing the first substrate;
   forming a coating layer on the black matrix layer and the opening;
   forming a light shielding layer on the second substrate facing the opening, the area of the light shielding layer being larger than the area of the opening;
   forming a insulator layer on the light shielding layer and the second substrate; and
   forming a sealant layer between the coating layer and the insulator layer.

2. The method of manufacturing a thin film transistor liquid crystal display device as claimed in claim 1, wherein the first substrate is color filter substrate.

3. The method of manufacturing a thin film transistor liquid crystal display device as claimed in claim 1, wherein the second substrate is thin film transistor array substrate.

4. The method of manufacturing a thin film transistor liquid crystal display device as claimed in claim 1, wherein the light shielding layer is made of metal.

5. A thin film transistor liquid crystal display device, comprising:
   a first substrate and a second substrate, the first substrate positioned facing the second substrate;
   a black matrix layer formed on the first substrate, the black matrix layer including an opening exposing the first substrate;
   a coating layer formed on the black matrix layer and the opening;
   a light shielding layer formed on the second substrate facing the opening, the area of the light shielding layer being larger than the area of the opening;
   a insulator layer formed on the light shielding layer and the second substrate; and
   a sealant layer formed between the coating layer and the insulator layer.

6. The thin film transistor liquid crystal display device as claimed in claim 5, wherein the first substrate is color filter substrate.

7. The thin film transistor liquid crystal display device as claimed in claim 5, wherein the second substrate is thin film transistor array substrate.

8. The thin film transistor liquid crystal display device as claimed in claim 5, wherein the light shielding layer is made of metal.

* * * * *